United States Patent
Agrikola

(10) Patent No.: US 6,734,673 B2
(45) Date of Patent: May 11, 2004

(54) APPARATUS AND METHOD FOR MAGNETIC RESONANCE IMAGING EMPLOYING PARTIAL PARALLEL ACQUISITION WITH FORMATION OF SIGNAL COMBINATIONS AND SOLVING OF AN EQUATION SYSTEM BASED THEREON

(75) Inventor: Juergen Agrikola, Eltmann (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/236,691

(22) Filed: Sep. 6, 2002

(65) Prior Publication Data

US 2003/0069495 A1 Apr. 10, 2003

(30) Foreign Application Priority Data

Sep. 11, 2001 (DE) .......................... 101 44 654

(51) Int. Cl.$^7$ ................................ G01V 3/00
(52) U.S. Cl. ................ 324/318; 324/307; 324/309
(58) Field of Search ................. 324/307, 309, 324/318

(56) References Cited

U.S. PATENT DOCUMENTS

| | | | |
|---|---|---|---|
| 5,394,087 A | * | 2/1995 | Molyneaux ................ 324/318 |
| 5,587,656 A | * | 12/1996 | Van Heels-Bergen et al. ........... 324/307 |
| 5,910,728 A | * | 6/1999 | Sodickson ................. 324/309 |
| 5,951,474 A | * | 9/1999 | Matsunaga et al. ......... 600/422 |
| 6,289,232 B1 | * | 9/2001 | Jakob et al. ............... 600/410 |
| 6,493,572 B1 | * | 12/2002 | Su et al. ................... 600/422 |
| 6,556,010 B2 | * | 4/2003 | Van Den Brink et al. .. 324/309 |

OTHER PUBLICATIONS

Sodickson et al, "Simultaneous Acquisiton of Spatial Harmonics (SMASH): Fast Imaging with Radiofrequency Coil Arrays", *Magnetic Resonance in Medicine*, vol. 38 (1997), pp. 591–603.

"Resolution Enhancement in Single–Shot Imaging Using Simultaneous Acquisition of Spatial Harmonics (SMASH)," Griswold et al., Magnetic Resonance in Medicine, Vol. 41 (1999), pp. 1236–1245.

* cited by examiner

*Primary Examiner*—Christopher W. Fulton
*Assistant Examiner*—Dixomara Vargas
(74) *Attorney, Agent, or Firm*—Schiff Hardin LLP

(57) ABSTRACT

In a magnetic resonance tomography apparatus and a method for operating such an apparatus employing a "partially parallel acquisition" (PPA), the number of the k-rows to be determined in a readout cycle corresponds to the number of coils, so that exposure time for acquiring an MR image is shortened for a given image quality, or the image quality is enhanced for a given exposure time.

11 Claims, 9 Drawing Sheets for $I_\nu^K = -1, 0, 1$ there are $3^3 = 27$ combinations given 3 coils

Examples of combinations of $i_1(x,y)$, $i_2(x,y)$, $i_3(x,y)$

| K | $I_1^K$ | $I_2^K$ | $I_3^K$ | $i^K(x,y) = I_1^K \cdot i_1(x,y) + I_2^K \cdot i_2(x,y) + I_3^K \cdot i_3(x,y)$ |
|---|---|---|---|---|
| 1 | -1 | 1 | -1 | |
| 2 | 1 | 1 | 0 | |
| 3 | 1 | 0 | 1 | |
| 4 | 0 | -1 | 1 | |
| ⋮ | ⋮ | ⋮ | ⋮ | ⋮ |

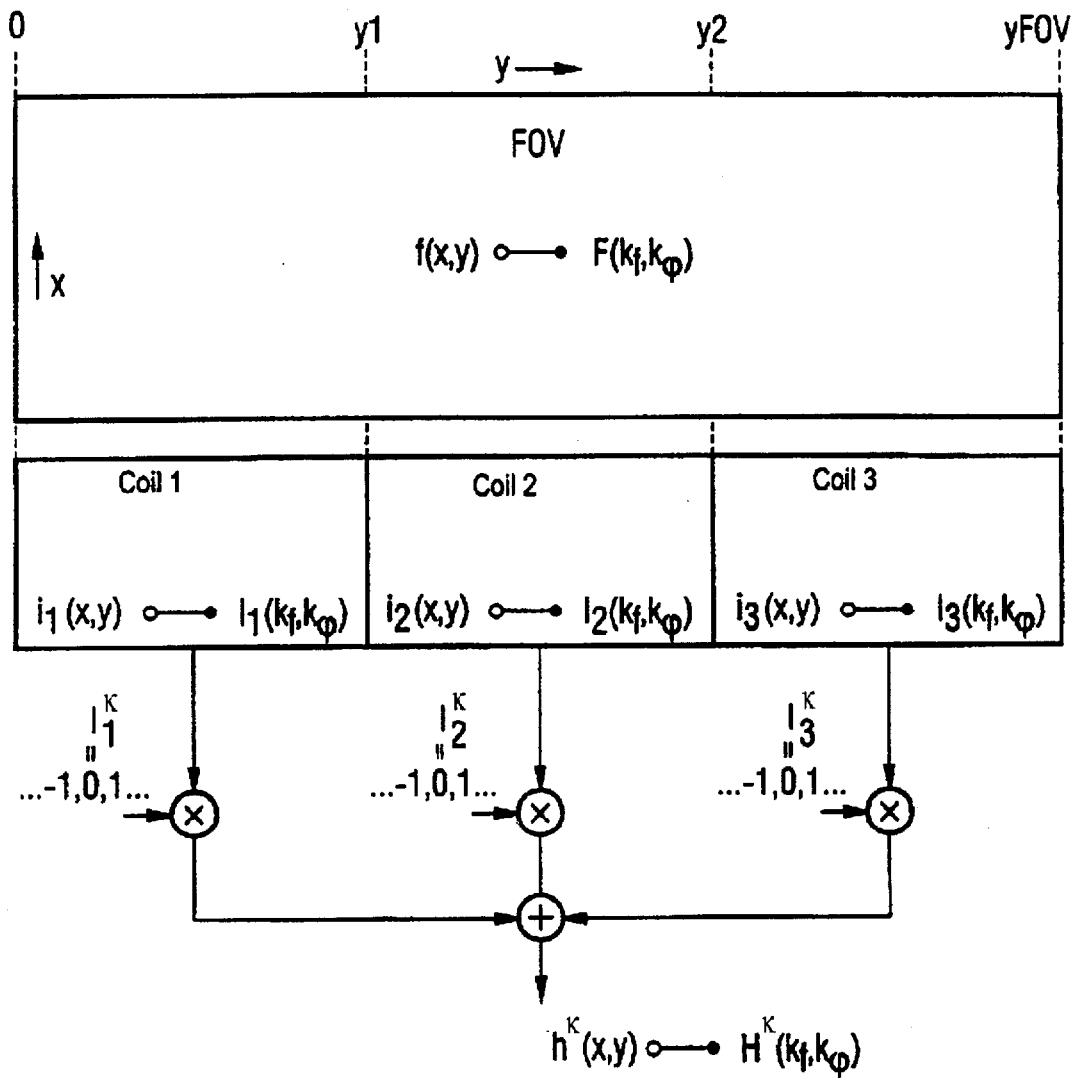

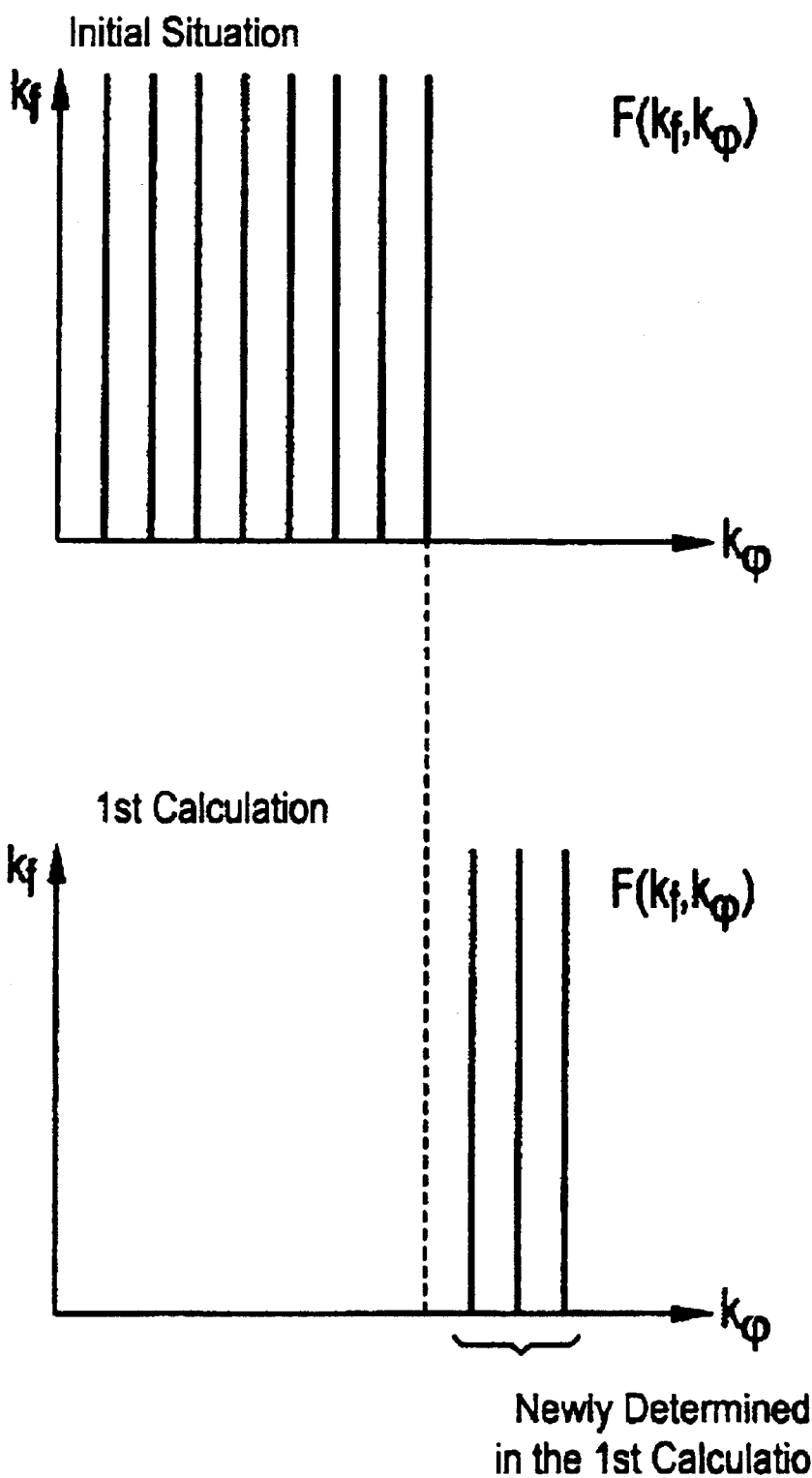

FIG 6
Initial Situation
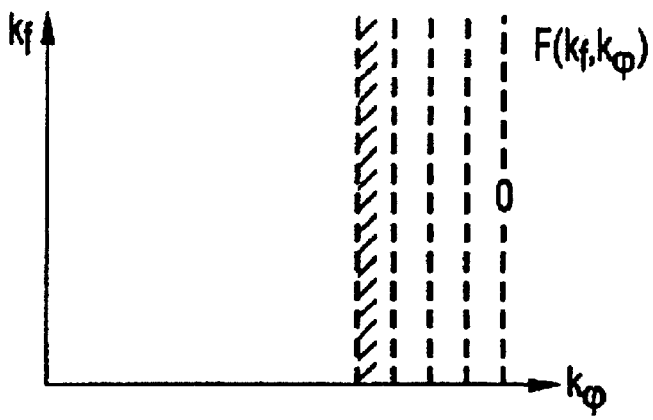
1st Calculation
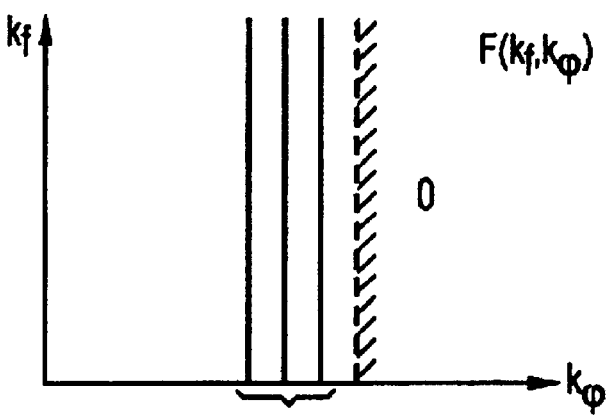
newly determined
in the 1st calculation
2nd Calculation
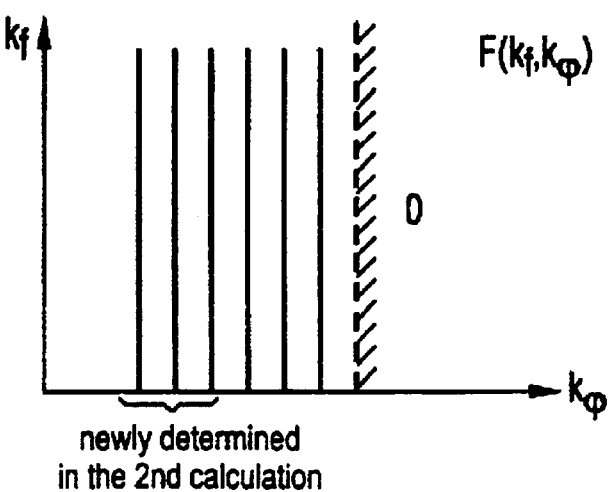
newly determined
in the 2nd calculation

FIG 7
First Calculation
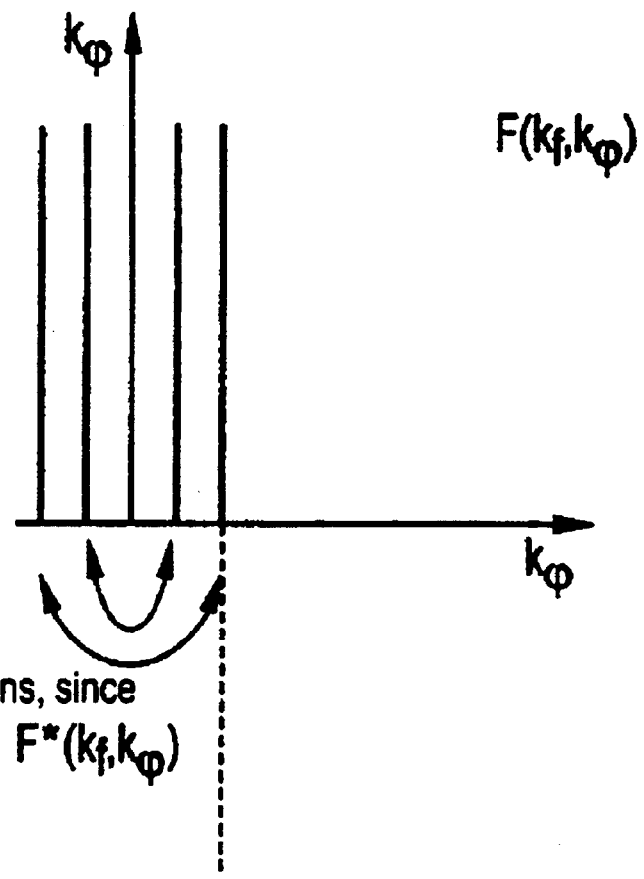
only 3 unknowns, since
$F(k_f, -k_\varphi) = F^*(k_f, k_\varphi)$
2nd Calculation
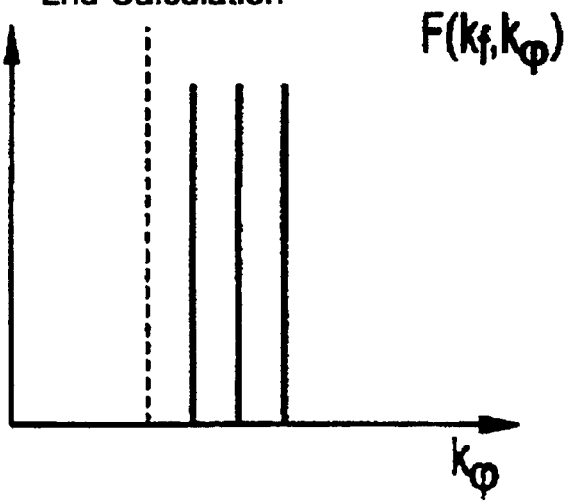

FIG 8A

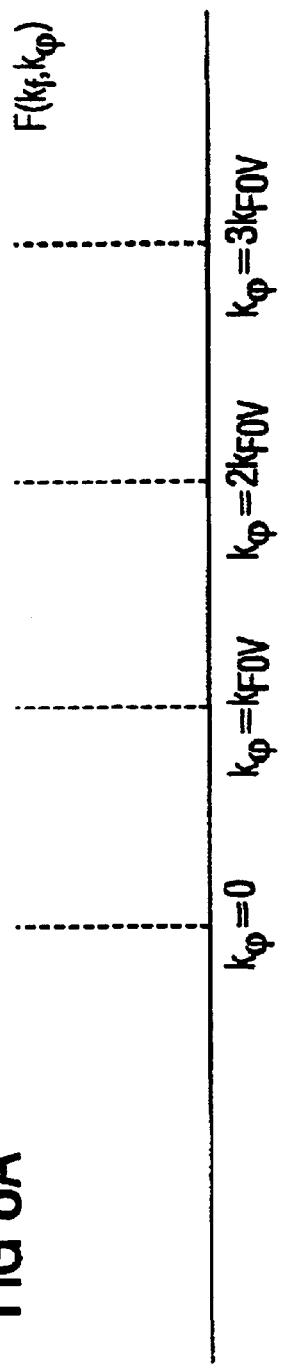

$$F(k_f, k_\varphi)$$

$k_\varphi = 0 \quad k_\varphi = k_{FOV} \quad k_\varphi = 2k_{FOV} \quad k_\varphi = 3k_{FOV}$ Measurement $k_\varphi = 0$:

$$H^1(k_f, k_\varphi = 0) = $$
$$= \sum_{\nu=-\infty}^{-1} C_\nu^1 F(k_f, 0 - \nu k_{FOV}) + C_0^1 F(k_f, 0) + C_1^1 F(k_f, 0 - k_{FOV}) + C_2^1 F(k_f, 0 - 2k_{FOV}) + C_3^1 F(k_f, 0 - 3k_{FOV}) + \sum_{\nu=4}^{\infty} C_\nu^1 F(k_f, 0 - \nu k_{FOV})$$

$$H^2(k_f, k_\varphi = 0) = $$
$$= \sum_{\nu=-\infty}^{-1} C_\nu^2 F(k_f, 0 - \nu k_{FOV}) + C_0^2 F(k_f, 0) + C_1^2 F(k_f, 0 - k_{FOV}) + C_2^2 F(k_f, 0 - 2k_{FOV}) + C_3^2 F(k_f, 0 - 3k_{FOV}) + \sum_{\nu=4}^{\infty} C_\nu^2 F(k_f, 0 - \nu k_{FOV})$$

FIG 8B

Measurement $k_\varphi = k_{FOV}$:

$$H^1(k_f, k_\varphi = k_{FOV}) =$$

$$= \sum_{\nu=-\infty}^{\infty} C_\nu^1 F(k_f, k_{FOV} - \nu k_{FOV}) + C_1^1 \underbrace{F(k_f, k_{FOV} - k_{FOV})}_{F(k_f, 0)} + C_2^1 \underbrace{F(k_f, k_{FOV} - 2k_{FOV})}_{F(k_f, 0 - k_{FOV})} + C_3^1 \underbrace{F(k_f, k_{FOV} - 3k_{FOV})}_{F(k_f, 0 - 2k_{FOV})} + C_4^1 \underbrace{F(k_f, k_{FOV} - 4k_{FOV})}_{F(k_f, 0 - 3k_{FOV})} +$$

$$\underbrace{\sum_{\nu=5}^{\infty} C_\nu^1 F(k_f, k_{FOV} - 5k_{FOV})}_{= 0}$$

↑ 1st Unknown  ↑ 2nd Unknown  ↑ 3rd Unknown $$H^2(k_f, k_\varphi = k_{FOV}) =$$

$$= \sum_{\nu=-\infty}^{\infty} C_\nu^2 F(k_f, k_{FOV} - \nu k_{FOV}) + C_1^2 F(k_f, k_{FOV} - k_{FOV}) + C_2^2 F(k_f, k_{FOV} - 2k_{FOV}) + C_3^2 F(k_f, k_{FOV} - 3k_{FOV}) +$$

$$\underbrace{C_4^2 F(k_f, k_{FOV} - 4k_{FOV}) + \sum_{\nu=5}^{\infty} C_\nu^2 F(k_f, k_{FOV} - 5k_{FOV})}_{= 0}$$

↑ 4th Unknown

APPARATUS AND METHOD FOR MAGNETIC RESONANCE IMAGING EMPLOYING PARTIAL PARALLEL ACQUISITION WITH FORMATION OF SIGNAL COMBINATIONS AND SOLVING OF AN EQUATION SYSTEM BASED THEREON

BACKGROUND OF THE INVENTION

The present invention is directed in general to magnetic resonance tomography (MRT) as employed in medicine for examining patients. The present invention is particularly directed to a magnetic resonance tomography apparatus as well as to a method for operating such an apparatus wherein data are acquired by a technique known as "partially parallel acquisition" (PPA).

DESCRIPTION OF THE PRIOR ART

MRT is based on the physical phenomenon of nuclear magnetic resonance and has been successfully utilized as an imaging method in medicine and in biophysics for more than 15 years. In this examination method, the subject is exposed to a strong, constant magnetic field. As a result, the nuclear spins of the atoms in the subject, which were previously irregularly oriented, are aligned. Radio frequency waves can then excite these "ordered" nuclear spins to a specific oscillation. This oscillation generates the actual measured signal in MRT that is picked up with suitable reception coils. By utilizing non-uniform magnetic fields generated by gradient coils, signals from the examination subject can thereby be spatially encoded in all three spatial directions. The method allows a free selection of the slice to be imaged, so that tomograms of the human body can be registered in all directions. MRT as a tomographic method in medical diagnostics is mainly distinguished as a "non-invasive" examination method on the basis of a versatile contrast capability. Due to the excellent presentation of soft tissue, MRT has developed into a method that is often superior to X-ray computed tomography (CT). MRT is currently based on the application of spin echo and gradient echo sequences that enable an excellent image quality given measurement times on the order of magnitude of minutes.

The constant technical improvement of the components of MRT apparatus and the introduction of fast imaging sequences have increased the areas of employment in medicine for MRT. Real-time imaging for supporting minimally invasive surgery, functional imaging in neurology and perfusion measurement in cardiology represent only a few examples. Despite the technical progress designing the components of an MRT apparatus, the exposure time of an MRT image remains the limiting factor for many applications of MRT in medical diagnostics. A limit is placed on a further enhancement of the performance of MRT apparatus from a technical point of view (feasibility) and for reasons of patient protection (stimulation and tissue heating). In recent years, many efforts therefore were made to develop and establish new approaches in order to achieve further shortening of the image measurement time.

One approach for shortening the acquisition time is to reduce the quantity of image data to be recorded. In order to obtain a complete image from such a reduced dataset, either the missing data must be reconstructed with suitable algorithms or the faulty image from the reduced data must be corrected. The registration of the data in MRT occurs in an arrangement referred to as k-space (synonym: frequency domain). The MRT image in the image domain is obtained by an operation on the MRT data in the k-space by means of Fourier transformation. The location coding of the subject that arises the k-space occurs by means of gradients in all three spatial directions. A distinction is made between the slice selection (determines an exposure slice in the subject, usually the z-axis), the frequency coding (determines a direction in the slice, usually the x-axis), and the phase coding (defines the second dimension within the slice, usually the y-axis). Without limitation placed on the universality, a Cartesian k-space is assumed below, this being sampled row-by-row. The data of a single k-space row are frequency-coded with a gradient when read out. Each row in the k-space has the spacing $\Delta k_y$ that is generated by a phase-coding step. Since the phase coding requires a long time compared to the other location codings, most methods for shortening the image measurement time are based on a reduction in the number of time-consuming phase coding steps. All method of the type known as "partially parallel acquisition" (referred to below as PPA) are based on this approach.

The basic idea in PPA imaging is that the k-space data are not registered by a single coil but by, for example, a linear arrangement of component coils, a coil array. Each of the spatially independent coils of the array carries certain spatial information that is used in order to achieve a complete location coding by a combination of the simultaneously acquired coil data. This means that a number of shifted data rows in the k-space that are omitted, i.e. not acquired, can be identified from a single registered k-space row.

PPA methods thus employ spatial information that is contained in (represented by) the components of the coil arrangement in order to partially replace the time-consuming phase coding that is normally generated employing a phase gradient. As a result, the image measurement time is reduced corresponding to the ratio of the number of rows of the reduced dataset to the number of rows of the conventional (i.e. complete) dataset. Compared to the conventional acquisition, only a fraction (½, ⅓, ¼, etc.) of the phase coding rows are acquired in a typical PPA acquisition. A specific reconstruction is then applied to the data in order to reconstruct the missing k-space rows, and thus to obtain the full field-of-view (FOV) image in a fraction of the time.

Some of these PPA techniques (SMASH, SENSE, GSMASH) are successfully utilized in many areas of MRT. The most noteworthy is the SMASH method that was invented by Sodickson in 1997 (D. K. Sodickson, W. J. Manning, Simultaneous Acquisition of Spatial Harmonics (SMASH): Fast Imaging with Radio frequency Coil Arrays, Magn. Reson. Med. 38:591–603 (1997)) that is described in brief below.

SMASH stands for "Simultaneous Acquisition of Spatial Harmonics". As mentioned above, this is a PPA method. Data are simultaneously acquired from spatially separate and independent coils that are arranged in the phase-coding direction. By a linear combination of these coil data, a spatial modulation of the signal that is achieved in conventional methods by activating a phase-coding gradient is achieved, with time-consuming phase-coding steps being saved as a result. Only a reduced k-space is thus registered, and the exposure time is shortened by an amount corresponding to the reduction of this k-space. This missing data are then reconstructed using suitable linear combinations of the coil datasets only after the actual data acquisition.

Sodickson et al. thus shows that a row of the k-space can be reconstructed upon employing of linear combinations of the signals that have been acquired by an arrangement of coils according to the SMASH technique whenever $$\sum_{l=1}^{L} n_l^{(m)} i_l(y) = e^{im\Delta k_y} \quad (1)$$

applies. The exponential term describes a sinusoidal modulation of the real part and of the imaginary part of the data. The number of oscillations of this modulation over the FOV is defined by the number m. For m=0, 1, 2, . . . , the spatial harmonic of the $0^{th}$, $1^{st}$, $2^{nd}$, . . . order of the coil sensitivities is referred to in this context.

The quantity $i_1(y)$ is the coil sensitivity of coil 1 from a total of L coils. Further, $n_1^{(m)}$ SMASH weighting factors are required for the linear combination of the coil sensitivities in order to generate spatial harmonics of the order m. The coil sensitivity profiles $i_1(y)$ are normally determined by a separate exposure using a proton density-weighted FLASH sequence or similar sequence. When the coil sensitivities are known, the spatial harmonics can be calculated therewith in a purely mathematical manner. Only the weighting factors $n_1^{(m)}$ thus remain as the sole unknown quantity in Equation (1). The determination of these coefficients is implemented such that the sensitivity profiles are fitted to the profiles of the spatial harmonics. Using these coil weighting factors, various rows can now be reconstructed from a single acquired row; this is established by $$S(k_y + m\Delta k_y) = \sum_{k_y=N_y/2}^{N_y/2-1} \sum_{l=1}^{L} n_l^{(m)} i_l(y) p(y) e^{ik_y y} \quad (2)$$

$$S(k_y + m\Delta k_y) = \sum_{k_y=N_y/2}^{N_y/2-1} p(y) e^{i(k_y + m\Delta k_y)y}. \quad (3)$$

wherein p(y) denotes the spin density of the image to be ultimately reconstructed along the y-axis (the x-dependency of the image was neglected for clarity). The procedure in the reconstruction is schematically shown in FIG. 2, this showing how an individual row is reconstructed from a different, acquired row.

In the SMASH method, the exact knowledge of the coil sensitivity distribution $i_1(y)$ of every coil along the y-direction is required, this usually being determined in a separate exposure. As a rule, it is very difficult to determine this distribution exactly, due to disturbances as a result of noise and spin density fluctuations within the subject. According to FIG. 2, an external coil card is employed in order to determine the complex coefficients for the linear combination of each of the datasets from coil 1 through coil L of each harmonic m (left). This makes it possible to reconstruct at least one offset row from a normally acquired row. At least two linear combinations are implemented, which leads to two shifted datasets 23 that are combined to form a complete dataset. This dataset is then Fourier-transformed in order to produce the ultimate image. This image has the composite sensitivity and the signal-to-noise ration S/R of a phase-sum image 24.

A significant disadvantage of SMASH and other PPA methods is that an attempt is made to develop the exponential function or cosine functions and sine functions by means of the coil sensitivity function. This incurs considerable limitations since the coil sensitivity functions ultimately must be of such a nature that the aforementioned functions can be described optimally well by such functions. In practice, this usually means that the required plurality of coils must be greater by a multiple than the degree of the harmonic that one wants to approximate—or conversely: with a given number of coils, only a limited, smaller number of k-rows can be reconstructed, and thus the exposure time for obtaining an MR image of a given image quality is limited.

SUMMARY OF THE INVENTION

It is an object of the present invention to shorten the exposure time for obtaining an MR image of a given image quality, or to enhance the image quality for a given exposure time.

This object is inventively achieved in a method having the following steps for magnetic resonance imaging or an interconnected region of a human body on the basis of a partially parallel acquisition (PPA) by exciting nuclear spins and measuring the radio frequency signals indicating the excited spins:

a) exciting the nuclear spins in the region, b) measuring the radio frequency response signals of the excited nuclear spins in the form of a simultaneous measurement of a radio frequency response signal of each component coil that has a characteristic sensitivity over the region, c) forming a number of different signal combinations from the number of radio frequency response signals on the basis of combinations of the component coil sensitivities defined for at least one spin excitation, d) applying the signal combinations of one or more spin excitations for entries into an ordered dataset, and e) implementing a spatial transformation of the filled and ordered dataset for generating a magnetic resonance image of the interconnected region.

Advantageously, the number of k-rows to be determined in a readout cycle corresponds to the number of coils, resulting in greater efficiency compared to conventional PPA methods, i.e., the exposure time for obtaining an MR image is shortened for a given image quality, or the image quality is enhanced given the same exposure time.

The method steps are executed run in a first sequence according to 1) spin excitation according to step a), 2) radio frequency response signal measurement according to step b), 3) forming the signal combinations according to step c), 4) repeating the steps 1) through 3) until a dataset of defined size has been obtained, and 5) implementing the steps d) and e), or alternatively in a second sequence employing 1') spin excitation according to step a), 2') radio frequency response signal measurement according to step b), 3') forming the signal combination according to step c), 4') applying the signal combinations from step c) according to step d), 5') repeating the steps 1') through 4') until a dataset of defined size has been obtained, and 6') implementing the step e).

Advantageously, the combination of the coil sensitivities of the component coils is approximated by a Fourier row.

The spatial transformation likewise represents a Fourier transformation.

Further, the above object is achieved according to the invention in an apparatus for magnetic resonance imaging having a magnet for generating a uniform magnetic field, a number of component coils for exciting nuclear spins in an interconnected region of a human body, as well as measuring the radio frequency response signals of the excited spins, with each component coil having a characteristic sensitivity over the region, and a radio frequency response signal of each coil is simultaneously measured. A system computer forming a number of different signal combinations from the number of response signals of a spin excitation on the basis of combinations of the coil sensitivities defined for at least one spin excitation. The signal combinations of a spin excitation or of a number of spin excitations are entered into the ordered dataset, and the computer implements a spatial transformation of the filled and ordered dataset into a magnetic resonance image over the interconnected region.

Advantageously, the spin excitation, the radio frequency response signal measurement and the formation of the signal combinations are repeated in the apparatus in this sequence until a dataset of a defined size has been obtained, whereupon the signal combination and the spatial transformation are implemented.

In a second embodiment of the invention, the spin excitation, the radio frequency response signal measurement, the forming of the signal combinations and the entry of the signal combinations are repeated in this sequence until a dataset of defined size has been obtained, whereupon the spatial transformation is implemented.

Preferably, the spatial transformation is a Fourier transformation.

The component coils preferably form a regular arrangement.

The component coils preferably form a linear arrangement.

DESCRIPTION OF THE DRAWINGS

FIG. 4 schematically illustrates an exemplary arrangement of the coils over the region to be imaged (field of view).

FIG. 5 schematically illustrates a first embodiment for determining the k-rows.

FIG. 6 schematically illustrates a second embodiment for determining the k-rows.

FIG. 7 schematically illustrates a third embodiment for determining the k-rows.

FIGS. 8A and 8B illustrate a further embodiment for determining the k-rows.

DESCRIPTION OF THE PREFERRED EMBODIMENTS

Figure 1:
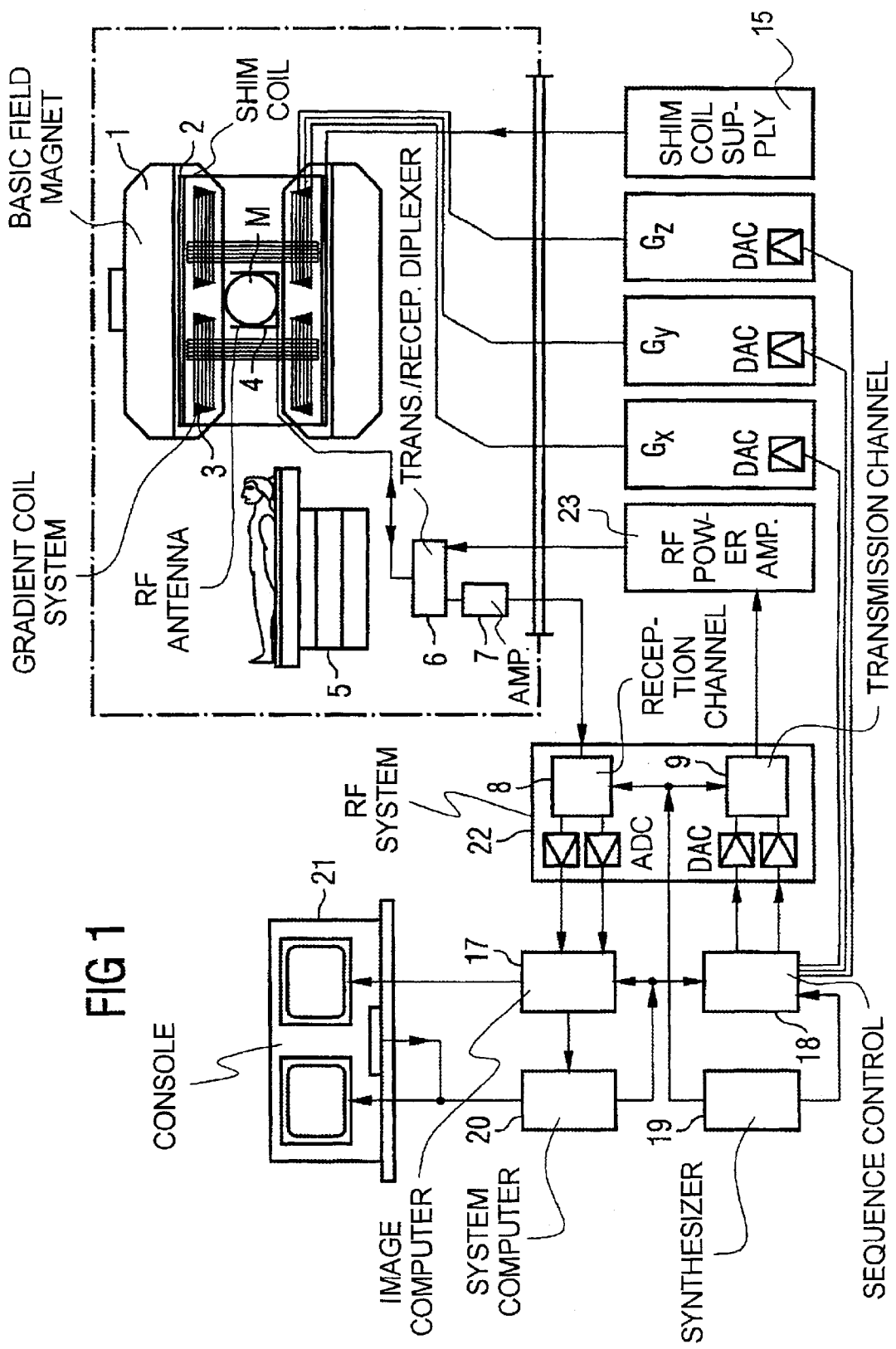
FIG. 1 schematically illustrates an exemplary embodiment of a magnetic resonance tomography apparatus operable in accordance with the invention.

FIG. 1 is a schematic illustration of an exemplary embodiment of a magnetic resonance imaging (tomography) apparatus for generating a magnetic resonance image of a subject according to the present invention. The structure of the magnetic resonance tomography apparatus thereby corresponds to the structure of a conventional tomography apparatus, but is operated by the system computer 20 and the sequence control 18 in accordance with the invention. A basic field magnet 1 generates a temporally constant, strong magnetic field for the polarization or alignment of the nuclear spins in the examination region of a subject such as, for example, of a part of a human body to be examined. The high uniformity of the basic magnetic field required for magnetic resonance measurement is defined in a spherical measurement volume M into which the part of the human body to be examined is introduced. Shim plates of ferromagnetic material may be attached at suitable locations for supporting the homogeneity demands and, in particular, for eliminating time-invariable influences. Time-variable influences may be eliminated by shim coils 2 that are driven by a shim power supply 15.

A cylindrical gradient coil system 3 that is composed of three sub-windings is introduced into the basic field magnet 1. An amplifier 14 supplies each sub-winding with current for generating a linear gradient field in the one direction of the Cartesian coordinate system. The first sub-winding of the gradient field system 3 thereby generates a gradient $G_x$ in the x-direction, the second sub-winding generates a gradient $G_y$ in the y-direction and the third sub-winding generates a gradient $G_z$ in the z-direction. Each amplifier 14 has a digital-to-analog converter that is driven by a sequence control 18 for generating gradient pulses at the correct time.

Situated within the gradient field system 3 is a radio frequency antenna 4 that converts the radio frequency pulses supplied by a radio frequency power amplifier 21 into a magnetic alternating field for exciting the nuclei and aligning the nuclear spins of the examination subject or the region of the subject to be examined. The radio frequency antenna 4 is composed of one or more radio frequency coils preferably in the form of a linear arrangement of component coils. The radio frequency coils of the radio frequency antenna 4 also convert the alternating field emanating from the processing nuclear spins, which are usually nuclear magnetic resonance echo signals produced by a pulse sequence composed of one or more radio frequency pulses and one or more gradient pulses, into a voltage that is supplied via an amplifier 7 to a radio frequency reception channel 8 of a radio frequency system 22. The radio frequency system 22 also has a transmission channel 9 in which the radio frequency pulses are generated for the excitation of nuclear magnetic resonance. The respective radio frequency pulses are digitally presented as a sequence of complex numbers on the basis of a pulse sequence in the sequence control 18 prescribed by the system computer 20. As real part and as imaginary part, the number sequence is supplied via an input 12 to a digital-to-analog converter in the radio frequency system 22 and from the latter to a transmission channel 9. In the transmission channel 9, the pulse sequences are modulated onto a radio frequency carrier signal whose base frequency corresponds to the resonant frequency of the nuclear spins in the measurement volume. The antenna 4 is driven with the modulated signal by an RF power amplifier 23.

The switching from transmission mode to reception mode ensues via a transmission-reception diplexer 6. The radio frequency coil of the radio frequency antenna 4 emits the radio frequency pulses for exciting the nuclear spins into the measurement volume M and samples resulting echo signals via the radiofrequency coils. The correspondingly acquired nuclear magnetic resonance signals are phase-sensitively demodulated in the reception channel 8 of the radiofrequency system 22 and are converted into real part and imaginary part of the measured signal via an analog-to-digital converter. An image computer 17 reconstructs an image from the measured data acquired in this way. The management of the measured data, the image data and the control programs ensues via the system computer 20. On the basis of a prescription with control programs, the sequence control 18 controls the generation of the desired pulse sequences and the corresponding sampling of k-space. In particular, the sequence control 18 controls the properly timed activation of the gradients, the emission of the radiofrequency pulses with defined phase and amplitude, as well as the reception of the magnetic resonance signals. The time base for the radiofrequency system 22 and the sequence control 18 is made available by a synthesizer 19. The selection of suitable control programs for generating a magnetic resonance image as well as the presentation of the magnetic resonance image ensues via a console 21 that has a keyboard as well as one or more picture screens.

The inventive method of partially parallel acquisition (PPA) is presented below, serving the purpose of speeding up the image acquisition using a radiofrequency coil arrangement for spatial coding. This technique, as realized for example in the magnetic resonance apparatus shown in FIG. 1, has the advantage over known methods as represented, for example, by SMASH, that a greater number of harmonics of $k_\phi$ can be calculated with a readout cycle $k_\phi$ without having to make specific demands on the coil sensitivities. This shall be explained on the basis of descriptions of the following figures.

Figures 3A, 3B:
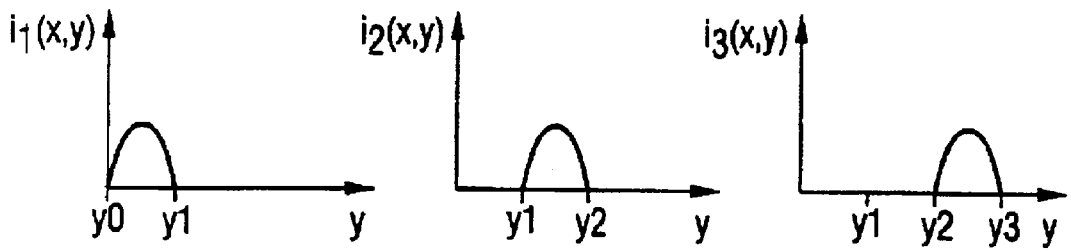
FIG. 3a schematically illustrates the sensitivity functions of the coils.
FIG. 3b schematically illustrates examples of different combinations of the individual sensitivity functions.

In an exemplary embodiment of the invention referred to below, three coils are linearly arranged in a row—in the y-direction here—over the region to be imaged (field of view, FOV). FIG. 3a schematically shows the sensitivity functions $i_1(x, y)$ of the individual coils that can, for example, each represent a Gauss function over the corresponding sensitivity region. Thus, the first coil has a bell-shaped sensitivity from $y_0$ through $y_1$, the second coil from $y_1$ through $y_2$ and the third from $y_2$ through $y_3$.

In reality, the sensitivity functions can be different and then no longer can be brought into coincidence by means of simple shifts. Likewise, the sensitivity functions can have complex values and may also detect signals from the exterior of the coil, i.e., the coils and/or their sensitivity regions can overlap.

As shown in FIG. 3b, the individual coil sensitivity functions $i_1(x, y)$, $i_2(x, y)$, $i_3(x, y)$ can be combined in different ways by multiplication with previously defined factors that can be real or complex. The number of defined factors can be designed 'a'. In FIG. 3b, a=3 applies and the defined factors are—in simplifying fashion—"–1", "0" and "1". On the basis of these three possibilities of signal selection per coil, $3^n$ combinations of the signals are received from coils for a readout cycle. In the case of 'a' factors, there are 'a' possibilities of the signal selection per coil and $a^n$ combinations for a readout cycle are thus obtained given n coils. In general, an overall sensitivity $$i^\kappa(x,y) = l_1^\kappa i_1(x,y) + l_2^\kappa i_2(x,y) + l_3^\kappa i_3(x,y) \quad (4)$$

thus is obtained for a specific combination $\kappa$, wherein $l_1^\kappa$, $l_2^\kappa$, $l_3^\kappa$ in the case of the example from FIG. 3a can assume the values "1", "0" and "–1". In the example of FIG. 3b, the combination $\kappa=1$ has the 1-values "–1", "1", "–1", the combination $\kappa=2$ has the values "1", "1", "0", etc.

The combinations $\kappa$ form a linear equation system with $\kappa=3^n$ equations. These $3^n$ equations, or in general $a^n$ equations, however, are not all linearly independent, as the following example shows.

In FIG. 3, $i(x, y)$ is obtained for $\kappa=2$ from the difference of $i(x, y$ for $\kappa=4$ and $i(x, y)$ for $\kappa=3$.

Due to the different multiplication of the individual coil sensitivities, the overall sensitivity function $i^\kappa(x, y)$ is a signal with an alternating component that can be periodically expanded for each $\kappa$ and then presented in a series, for example a Fourier series.

Below, the dependency of the sensitivity function on spatial coordinates other than y (or their corresponding variables in the frequency domain, i.e. x and $k_f$) is no longer shown since the coils in the exemplary embodiment of the invention are arranged along the y-axis and only the phase-coded spatial axis y thus is considered. All signals due to the other two spatial axes for a fixed y-coordinate or $k_\phi$-coordinate are combined here in one spectrum and are not treated, since they have no influence on the principle but merely increase the number of equations in the practical realization.

The overall sensitivity function in the form of a Fourier series developed over y has the following form:

$$i^\kappa(y) = \sum_{v=-m}^{m} c_v^\kappa e^{ivk_{FOV}y} \quad (5)$$

The coefficients of the Fourier series are represented by $c_v^\kappa$. $\kappa$ denotes one of the $3^n$ combinations, v indicates the harmonic of the basic frequency for the Fourier series and ranges from –m through m. m thus specifies the highest harmonic that is employed for the description of the overall sensitivity function $i^\kappa(y)$ by a Fourier series. The basic frequency is derived by $k_{FOV}=2\pi/y_{FOV}$ for a given FOV in the y-direction.

The series-expanded sensitivity coefficients $c_v^\kappa$ must be stored, for example in the system computer 20 (FIG. 1). They are required later during or after the measurement in order—as explained later—to be able to calculate the values needed for the imaging with the measured values.

For illustration, FIG. 4 schematically shows the region (field of view, FOV) that is to be registered with the magnetic resonance tomograph. As described in FIG. 3a, the three coils are linearly arranged in the y-direction. As already mentioned, FIGS. 3a, 3b and 4 only show an exemplary embodiment of the invention. For example, the individual coils can overlap, etc. The variables in the spatial domain are x and y; the variables in the frequency domain (k-space) in which measurement is actually carried out are $k_\phi$ and $k_f$. Upper case letters are used for presenting the physical quantities in the frequency domain and lower case letters are employed for the presentation in the spatial domain.

The combined sum signal of the spatial domain is then obtained by multiplication of the location signal $f(x, y)$ of the subject by the corresponding overall sensitivity function $i^\kappa(x, y)$, whereby K defines a specific combination of the individual sensitivities $$i_1(x, y), i_2(x, y), i_3(x, y) : h^\kappa(x, y) = i^\kappa(x, y) f(x, y) \quad (6)$$

However, measurement is carried out in the frequency domain, so that $h(x, y)$ must be integrated, i.e. Fourier-transformed overall, over the corresponding region of interest $x_{FOV}$ and $y_{FOV}$:

$$H^\kappa(k_f, k_\phi) = \int_0^{x_{FOV}} \int_0^{y_{FOV}} i^\kappa(x, y) f(x, y) e^{-ik_f x - ik_\phi y} dx dy$$

When the overall sensitivity function $i^\kappa(x, y)$ is replaced by the term of its Fourier series (see Equation (5)), then the $a^n$ equations of the sum of the combined coil signals in the frequency domain can be written as follows:

$$H^\kappa(k_f, k_\varphi) = \int_0^{xFOV} \int_0^{yFOV} \left( \sum_{v=-m}^{m} c_v^\kappa e^{ivk_{FOV}y} \right) f(x, y) e^{-ik_f x - ik_\varphi y} dx dy \quad (7)$$

$$= \sum_{v=-m}^{m} c_v^\kappa \int_0^{xFOV} \int_0^{yFOV} f(x, y) e^{ivk_{FOV}y} e^{-ik_f x - ik_\varphi y} dx dy$$

$$= \sum_{v=-m}^{m} c_v^\kappa \int_0^{xFOV} \int_0^{yFOV} f(x, y) e^{-ik_f x - i(k_\varphi - vk_{FOV})y} dx dy$$

and, thus, $$H^\kappa(k_f, k_\varphi) = \sum_{v=-m}^{m} c_v^\kappa F(k_f, k_\varphi - vk_{FOV})$$

With κ=1 ... n, Equation (7) yields an equation system with n linearly independent equations. Thus, n unknowns F($k_f$, $K_\varphi - vk_{FOV}$) can be determined. n (=number of coils) linearly independent $H^\kappa(k_f, k_\varphi)$ values can be measured. Which combinations or whether all combinations—characterized by κ—from the $a^n$ equations are utilized for the calculation of the F-values is decided on a case-by-case basis. It must be taken into consideration in the solution of the equation system (7) that, due to the approximation of the functions, for example by Fourier series, and the measuring imprecision, the equations cannot be exactly solved, particularly given more than n equations. Methods that, for example, minimize the sum of the quadratic deviations between the left and right sides of the equations offer an approximate solution.

In summary, the following can be stated: When n $H^\kappa$ vectors of a k-space line $k_\varphi$ are acquired with a coil array of n component coil (due to point-by-point sampling in $k_f$ direction, this k-space line is composed of discrete values and supplies a vector as the measured result) then it is possible to determine n further k-space lines $k_\varphi$ or the physical quantity F($K_{100} - vk_{FOV}$) of interest using the corresponding, known coefficients $c_v^\kappa$.

Figure 2:
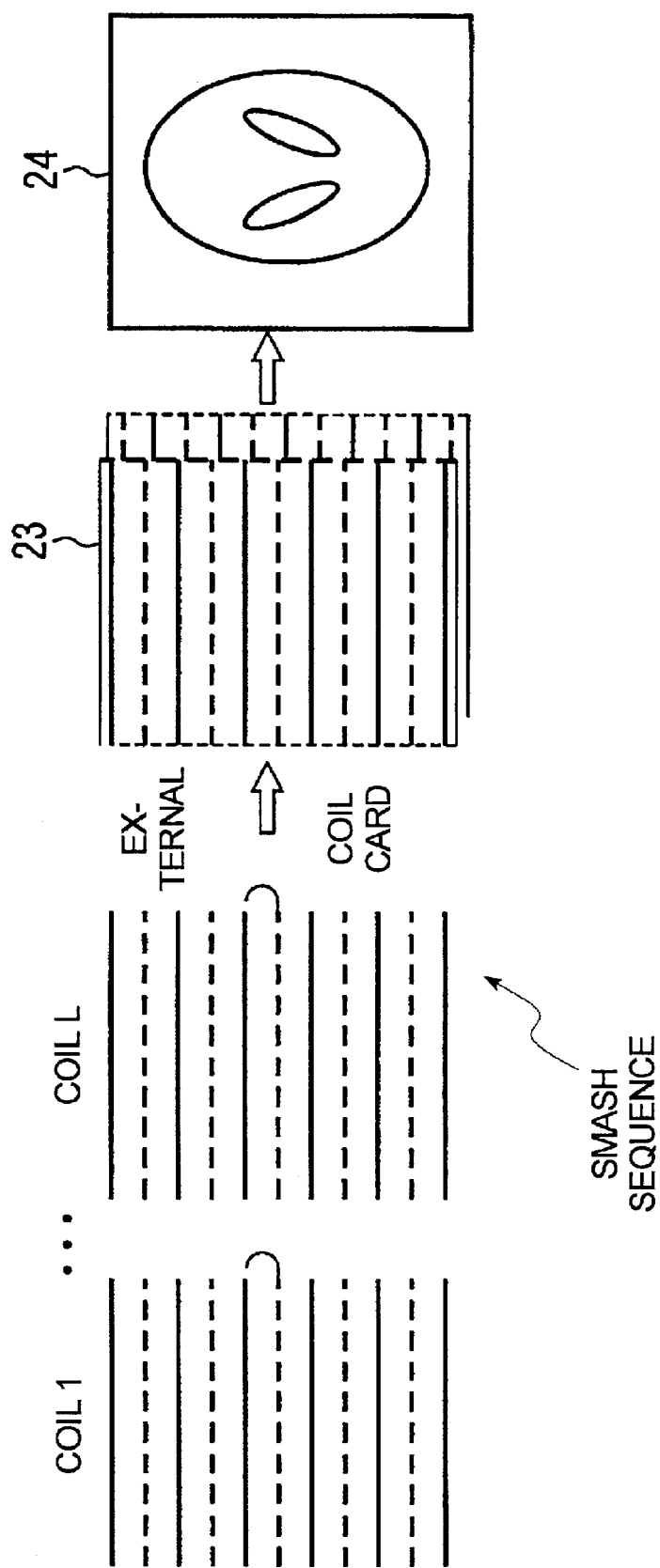
FIG. 2, as noted above, schematically illustrates an image reconstruction according to the SMASH method.

FIGS. 5, 6 and 7 show three embodiments for determining the k-rows from a measurement. All three cases are oriented to the exemplary embodiment of the invention according to FIGS. 1 and 2, i.e. to an array of three coils arranged in the y-direction.

Accordingly, the number of unknowns F($k_f$, $K_\varphi - vk_{FOV}$) to be calculated is limited to n. In the examples of FIGS. 5, 6 and 7, thus, the corresponding $c_v^\kappa$ to be multiplied must be zero or the corresponding F-value already must be known when n F-values is exceeded.

FIG. 5 shows an initial situation in which 8 k-rows are already known. Three further k-rows can then be calculated on the basis of a further measurement with the three component coils. Overall, 11 k-rows thus are employed in the calculation. The overall sensitivity functions $i^\kappa(y)$ of the coils thus can be described with Fourier coefficients up to the $5^{th}$ harmonic. The region can be expanded by 3 k-rows in further measuring steps.

FIG. 6 shows an initial situation as is usually established in practice. Due to the limited memory space, the values for F($k_\varphi$) are not stored above a certain $k_\varphi$ value; the function thus is set to zero for high $k_\varphi$ values. In the first step, the n=3 k-rows are determined for the highest values of $k_\varphi$. Since, so to speak, one is "at the edge" an arbitrary number of harmonics can be employed for the description of the overall sensitivity functions $i^\kappa(y)$ since all k-rows except the n=3 k-rows to be determined are weighted with zero-value coefficients. In the further steps, the k-space is expanded in the direction of decreasing $k_\varphi$ values in that a further n=3 k-rows are determined per step.

FIG. 7 shows a further example. In determining the first k-rows, one can make use of the fact that the measured quantity f(y) in the spatial domain is real, and thus the Fourier transform F($k_\varphi$) is equal to its complex-conjugate F'($k_\varphi$)=F($-k_{100}$). 5 k-rows thus can be employed in the calculation, which means that the overall sensitivity functions $i^\kappa(y)$ can be described with Fourier coefficients up to the second harmonic. In the following steps, only n=3 new k-rows are then determined again in the increasing $k_\varphi$-direction. A variation of Equation (7) is to not directly determine the k-rows F($k_f$, $k_\varphi$) by solving the equation system but instead to determine an intermediate image in the k-space or, also in the spatial domain. The overall sensitivity functions are respectively presented as product of two functions:

$$i^\kappa(x,y) = j^\kappa(x,y) \cdot g(x,y)$$

The functions $i^\kappa(x, y)$ can be approximated by a Fourier series:

$$j^\kappa(x, y) = \sum_{v=-m}^{m} d_v^\kappa e^{ivk_{FOV}y}$$

The k-rows of the intermediate image Z($k_f$, $k_\varphi$) are obtained, analogous to (7), from the solution of the following equation system:

$$H^\kappa(k_f, k_\varphi) = \sum_{v=-m}^{m} d_v^\kappa Z(k_f, k_\varphi - vk_{FOV})$$

The following is valid for the intermediate image:

$$Z(k_f, k_\varphi) = \int_0^{xFOV} \int_0^{yFOV} g(x, y) f(x, y) e^{-ik_f x - ik_\varphi y} dx dy$$

The final image f(x, y) is then obtained, for example, by post-processing of the intermediate image in the location space according to the following equation:

$$f(x, y) = \frac{z(x, y)}{g(x, y)}$$

FIGS. 8A and 8B show a further version of the inventive method. In this version, it is possible to describe the overall sensitivity functions $i^\kappa(y)$ with arbitrary precision using Fourier coefficients independently of all other influencing factors, for example the number of coils. This means that m can be arbitrarily selected in Equation (5).

According to FIGS. 8A and 8B, for example, an image in k-space is to be composed of 4 k-rows. The exposure of the image with 2 coils arranged along the y-axis ensues according to the following steps:

Two measurements with the phase codings $k_\varphi$=0 and $k_\varphi = k_{FOV}$ are implemented. Two independent equations per measurement according to Equation (7) can be recited from these measurements. These four equations are entered in FIG. 8A under the k-space shown in the upper portion of the figure. Given a description of the overall sensitivity functions $i^\kappa(y)$ with Fourier coefficients (infinitely many in the limit case), these equations can comprise infinitely many summands. Due to the finite memory space or because of a finite number of measurements to be implemented, F($k_\varphi$) in the k-space is assumed to be zero above a specific $k_\varphi$-value, so the summands of the equations from FIGS. 8A and 8B partially disappear because $F(k_\varphi)$ (or $F(k_f, k_\varphi)$, which is equivalent) has the value zero therein. $c_v^\kappa$ need riot be assumed as zero. The equations of FIGS. 8A and 8B can be solved after the two measurements with their four unknowns. The complete image in the k-space is obtained as a result. This example also shows that the two measurements need not have any specific spacing in their phase coding; rather two arbitrary but whole-numbered values of FOV can be selected from the four phase codings and the measurements can be implemented for these.

Instead of the measurements of k-rows distributed over the entirety of k-space, there can be a limitation to a k-space region of $k_\varphi = q_1 * k_{FOV}$ through $k_\varphi = q_2 * k_{FOV}$. $2*m+1-n$ k-rows in arbitrary position must then already be known as initial situation in this region (no k-row need be known for $2*m+1-n<0$). All unknown rows of this region can then be determined from u measurements $$u = \text{WHOLE}((q_2 - q_1 + 1) - (2*m + 1 - n)/n) =$$
$$\text{WHOLE}((q_2 - q_1 + 1) - 2*m - 1 + n)/n).$$

WHOLE(($q_2-q_1+1$)−2*m−1+n)/n) means that ($q_2-q_1+1$)−2*m−1+n)/n is rounded up to the next-higher whole number; given a negative value or zero, the space to be measured can be enlarged or a measurement can be foregone since all k-rows are already known in this case.

The initial situations of FIGS. 6, 6, 7 and—dependent on the embodiment—of FIGS. 8A and 8B as well, can be determined by measurements of individual rows according to the Prior Art. This, of course, also means that the method disclosed herein in all of its versions can be combined with every method from the known prior art, i.e. this method, can be employed in alternation with other methods. As an example, 4 k-rows could be determined according to the method disclosed herein, and 5 k-rows could be subsequently determined by an individual measurement for each k-row. A motivation for this example could be an improvement of the image quality as the expense of the speed.

The central basis of the inventive concept is the description of the sensitivity functions by Fourier series and the possibility of obtaining a large number of different overall sensitivity functions by different combinations of the individual coils, and accordingly embodying all methods this basis central basis are within the scope of the invention This also applies to the determination of the Fourier coefficients of the functions $i^\kappa(x, y)$, that can be determined according to all known methods, for example by a Fourier analysis of the measured sensitivities of the individual coils, or of the functions $i^\kappa(x, y)$ calculated therewith, or from the k-rows that were acquired by individual measurements according to the prior art. In addition to supplying the k-row, namely, the individual measurements also supply the signals for each individual coil. The individual measurement combines the signals of the individual coils, so that only one row is determined. Parallel therewith, of course, the signals also can be combined (i.e., for example, multiplied by −1, 0, 1) such that the appertaining signals $H^\kappa$ are obtained. In the central equation (7) of the method described herein, thus, only the coefficients $c_v^\kappa$ are unknown and therefore can be identified. The determination of the coefficients, of course, also can be made arbitrarily often within an image exposure in order to thus take changes as may occur into consideration.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging comprising the steps of:
    (a) exciting nuclear spins in an interconnected region of a subject, and thereby causing radio frequency response signals to be emitted from said region;
    (b) receiving said radio frequency response signals simultaneously with each of a plurality of component coils, each of said component coils having a characteristic sensitivity over said region defined for at least one spin excitation, and thereby obtaining a plurality of received radio frequency response signals;
    (c) forming a plurality of different signal combinations from said plurality of received radio frequency response signals dependent on combinations of the respective characteristic sensitivities of said component coils, with each of said signal combinations represented as a term equated with a signal having an alternating component that can be periodically expanded and then presented in a series having sensitivity coefficients;
    (d) forming an ordered dataset from said signal combinations of at least one spin excitation by solving a linear system of equations given by the sensitivity coefficients of the respective series and the term of the associated signal combination; and
    (e) spatially transforming said ordered dataset to generate a magnetic resonance image of said region.

2. A method as claimed in claim 1 wherein the plurality of different signal combinations formed in Step (c) represent a raw dataset, and comprising the steps of repeating Steps (a), (b) and (c) until said raw dataset has a predetermined size, and thereafter executing Steps (d) and (e).

3. A method as claimed in claim 1 comprising repeating Steps (a), (b), (c) and (d) until said ordered dataset has a predetermined size, and thereafter executing Step (e).

4. A method as claimed in claim 1 comprising approximating said combination of the respective characteristic sensitivities of said plurality of component coils in Step (c) with a Fourier series.

5. A method as claimed in claim 1 comprising spatially transforming said ordered dataset in Step (d) with a Fourier transformation.

6. An apparatus for magnetic resonance imaging comprising:
    an examination unit adapted to receive a subject and having an RF antenna for exciting nuclear spins in an interconnected region of said subject, and thereby causing radio frequency response signals to be emitted from said region;
    said RF antenna having a plurality of component coils for simultaneously receiving said radio frequency response signals, each of said component coils having a characteristic sensitivity over said region defined for at least one spin excitation, and thereby obtaining a plurality of received radio frequency response signals;
    an image computer for forming a plurality of different signal combinations from said plurality of received radio frequency response signals dependent on combinations of the respective characteristic sensitivities of said component coils, with each of said signal combinations represented as a term equated with a signal having an alternating component that can be periodically expanded and then presented in a series having sensitivity coefficients, for forming an ordered dataset from said signal combinations of at least one spin excitation by solving a linear system of equations given by the sensitivity coefficients of the respective series and the term of the associated signal combination, and for spatially transforming said ordered dataset to generate a magnetic resonance image of said region.

7. An apparatus as claimed in claim 6 wherein said plurality of different signal combinations represent a raw dataset, and wherein said RF antenna continually excites said nuclear spins and said component coils continually receive said radio frequency response signals and said image computer continually forms said plurality of different signal combinations until said raw dataset has a predetermined size.

8. An apparatus as claimed in claim 6 wherein said RF antenna continually excites said nuclear spins and said component coils continually receive said radiofrequency response signals and said image computer continually forms said plurality of different signal combinations and forms said order dataset until said ordered dataset has a predetermined size.

9. An apparatus as claimed in claim 6 wherein said system computer employs a Fourier transformation as said spatial transformation.

10. An apparatus as claimed in claim 6 wherein said component coils form a regular arrangement.

11. An apparatus as claimed in claim 6 wherein said component coils form a linear arrangement.

* * * * *